United States Patent [19]
Duffy

[11] 3,958,235
[45] May 18, 1976

[54] LIGHT EMITTING DIODE DISPLAY APPARATUS AND SYSTEM

[76] Inventor: Francis A. Duffy, 5039 Smedley St., Philadelphia, Pa. 19141

[22] Filed: July 26, 1974

[21] Appl. No.: 492,245

[52] U.S. Cl. .......................... 340/336; 340/324 R; 340/373
[51] Int. Cl.² .......................................... G09F 9/32
[58] Field of Search ............... 178/6.6 R, 6.6 A, 7, 178/6; 340/324 R, 324 M, 336, 166 EL, 373

[56] References Cited
UNITED STATES PATENTS

| | | | |
|---|---|---|---|
| 2,817,815 | 12/1957 | Evans | 340/324 R |
| 3,052,755 | 9/1962 | Garfield | 178/6.6 R |
| 3,318,996 | 5/1967 | Garfield et al. | 178/6.6 A |
| 3,541,248 | 11/1970 | Young | 178/6.6 R |
| 3,634,849 | 1/1972 | Nichizawa et al. | 340/166 EL |
| 3,846,784 | 11/1974 | Sinclair | 340/336 |

*Primary Examiner*—Marshall M. Curtis
*Attorney, Agent, or Firm*—Joseph G. Denny, III; Peter J. Patane

[57] ABSTRACT

A light emitting diode display apparatus is disclosed wherein a plurality of diodes mounted in a row on a vibrating member are used to create a display. The light emitting diode display may be used as an oscilloscope to display various types of signals. Alternatively, the diode display apparatus may be used in conjunction with a camera system wherein a similar row of radiant energy sensors, such as photocells, are mounted on a vibrating member synchronized with the vibrating member of the display in order to sense the subject matter to be displayed. The camera-display system may be connected together by means of lines or coupled together by means of a telephone system.

The purpose of the above abstract is to provide a non-legal technical statement of the disclosure of the contents of the instant patent application and thus serve as a searching-scanning tool for scientists, engineers and researchers. Accordingly, this abstract is not intended to be used in understanding or otherwise comprehending the principles of the present invention hereinafter described in detail, nor is it intended to be used in interpreting or in any way limiting the scope or fair meaning of the claims appended hereto.

28 Claims, 7 Drawing Figures

LIGHT EMITTING DIODE DISPLAY APPARATUS AND SYSTEM

BACKGROUND OF THE INVENTION

This invention relates to a light emitting diode display apparatus and system. More particularly, this invention relates to a light emitting diode display apparatus comprised of a relatively simple structure which does not require a source of high voltage nor complex electronics to generate the display.

In the past, most display devices were constructed of the cathode-ray tube type which required a complex vacuum structure and a source of high potential in order to operate properly. Such structures were expensive to manufacture. Additionally, such structure required expensive cooperating components such as a high voltage power supply and expensive electronics to provide inputs to the electron beam deflecting means and focusing means.

United States patent 3,555,505-Srogi discloses an air space traffic simulator in which a plurality of lamps are mounted in a grid like network on vanes which are adapted to rotate about a shaft. Particular lamps in the grid are energized to indicate the position in space of an aircraft, its speed and other information. However, the lamp arrangement of Srogi is simply an indicating means which does not provide a true display of a picture or wave form. Furthermore, the structure disclosed in Srogi is completely different from that of the present invention.

Similar grid type displays using light emitting diodes have been disclosed in U.S. Pat. No. 3,696,393-McDonald and U.S. Pat. No. 3,740,570-Kaelin et al. However, the grid type structure disclosed in these patents is completely different from the vibrating member or element type of structure of the present invention.

SUMMARY OF THE INVENTION

An advantage of the present invention is that it provides a relatively simple and inexpensive structure for displaying various types of signals.

Another advantage of the present invention is that it provides a simple and inexpensive structure for a camera display system.

A still further advantage of the present invention is that it provides an inexpensive camera-display system which may be used to detect various types of electromagetic radiation including electromagnetic radiation in the wave length ranges of infrared, visible, ultraviolet and X-rays.

A still further advantage of the present invention is that it may be used to display images at great distances from the camera by use of a telephone adapter system.

Briefly, in accordance with the present invention, an apparatus is provided for displaying information contained in a signal. This apparatus includes a member having a plurality of light emitting devices arranged in a row. Means is provided for vibrating or moving said member back and forth at a predetermined rate. An electronic circuit means is provided for applying energization signals to selected ones of the plurality of light emitting devices in response to the signal containing information.

In another embodiment, an apparatus is provided for sensing an image and displaying the image. The apparatus includes a row of a plurality of radiant energy sensitive devices and a row of a plurality of energizable light emitting devices. Means is provided for causing the row of radiant energy sensitive devices to scan the image and to cause said row of light emitting devices to move in synchronism with said row of radiant energy sensitive devices. Means is provided for enabling each of the plurality of radiant energy sensitive devices and a corresponding one of said plurality of light emitting devices in sequence, and means is provided for applying the output of the enabled radiant energy sensitive device to the enabled light emitting device in order to display the image sensed by the radiant energy sensing devices.

BRIEF DESCRIPTION OF THE DRAWING

For the purpose of illustrating the invention, there are shown in the drawings forms which are presently preferred; it being understood, however, that this invention is not limited to the precise arrangements and instrumentalities shown.

DESCRIPTION OF THE PREFERRED EMBODIMENTS

Figure 1:
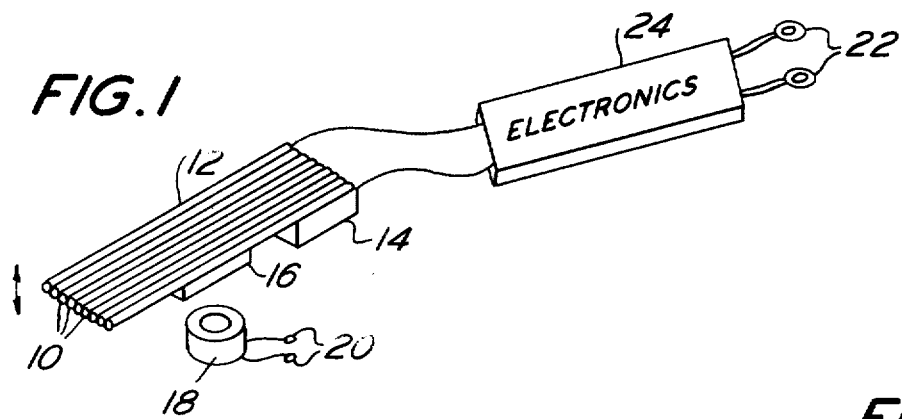
FIG. 1 is a view in perspective of one embodiment of the present invention disclosing light emitting devices mounted on a cantilevered member.

Referring now to the drawings, there is shown in FIG. 1 an embodiment of the invention wherein light emitting devices or light emitting diodes 10 are mounted on a cantilevered member or cantilever 12. Cantilever 12 is mounted on support member 14. Cantilever 12 is provided with a ferrous member 16. Cantilever 12 is caused to vibrate by means of coil 18 and ferrous member 16 when coil 18 is energized by a suitable source of electrical energy applied across its terminals 20. The resilient forces within cantilever 12 cause it to rebound when coil 18 is de-energized. Alternatively, a spring may be used to resiliently bias cantilever 12 away from coil 18.

The light emitting devices 10 are preferably light emitting diodes. However, other suitable minature light emitting devices may be used within the spirit of the teachings of the present invention. The light emitting devices 10 will be referred to hereinafter as light emitting diodes.

Figure 2:
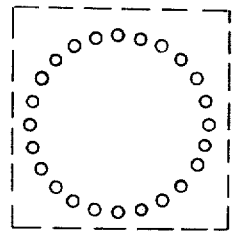
FIG. 2 is a drawing of a lissajou pattern created by the apparatus of the present invention in accordance with the teachings of the present invention.

The apparatus disclosed in FIG. 1 may be used to create lissajous patterns and perform other functions of an oscilloscope. For example, if a 60 Hertz sine wave signal is supplied to terminals 22 of electronic circuitry 24 and a 60 Hertz signal is applied to terminals 20 of coil 18, the lissajous pattern shown in FIG. 2 will be generated. The electronic circuitry 24 quantizes the input signal and energizes certain ones of the light emittting diodes 10 depending upon the instantaneous amplitude and polarity of the input signal applied to terminals 22. An embodiment of the electronic circuitry 24 is shown in FIG. 4 and will be described hereinafter.

Figure 3:
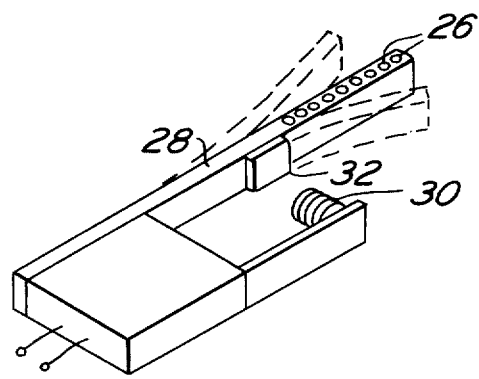
FIG. 3 is a drawing in perspective showing light emitting devices mounted on a reed type member.

Referring now to FIG. 3, there is shown an embodiment of the present invention wherein light emitting diodes 26 are mounted on member or reed 28. Reed 28 is caused to vibrate by means of an electromagnet or coil 30 which operates on reed 28 either by means of reed 28 being made of a magnetic material or by attaching a piece of magnetic material to reed 28 as shown as 32. The embodiment of FIG. 3 may be used to create similar lissajous patterns and perform other display functions.

Figure 4:
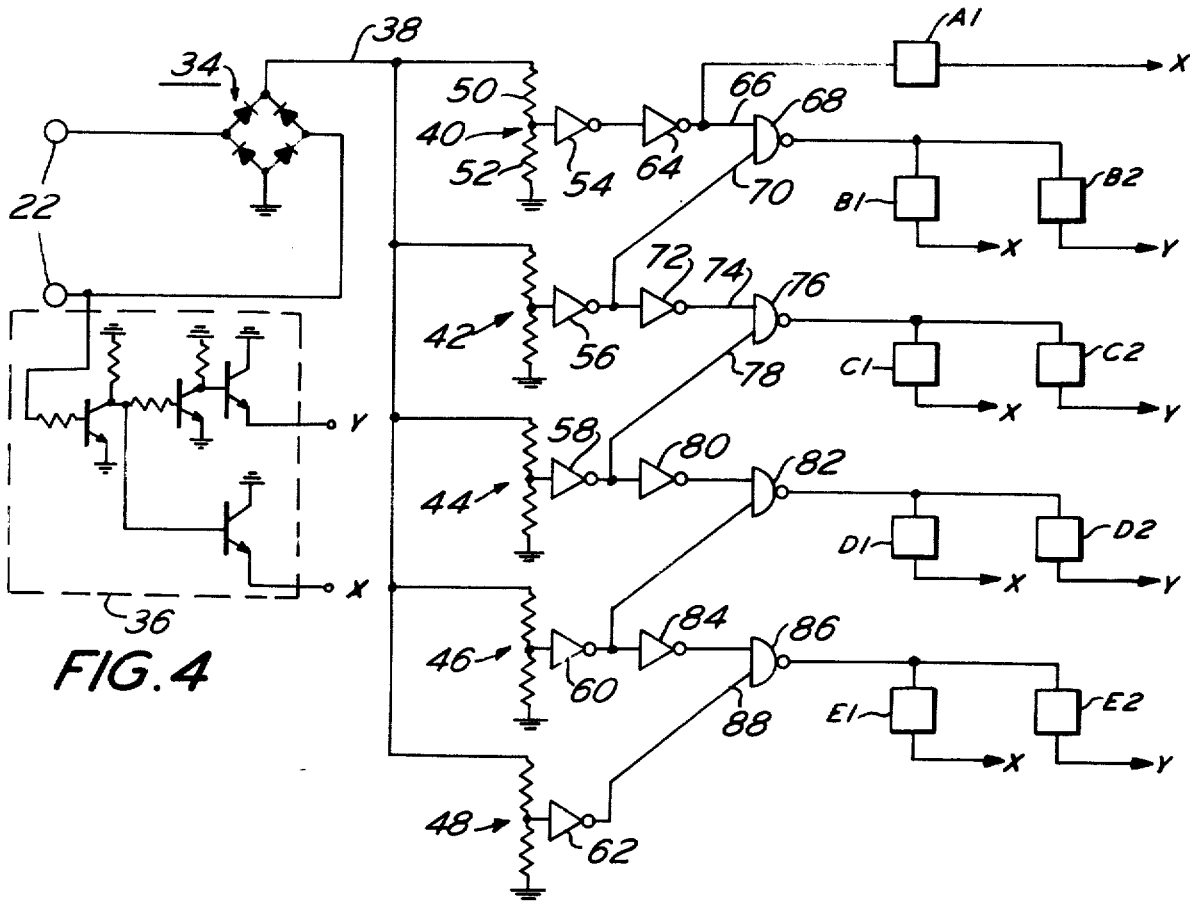
FIG. 4 is a schematic diagram, partially in block diagram form, of the electronic circuitry of FIG. 1.

Referring now to FIG. 4, there is shown a schematic diagram, partially in block diagram form, of a presently preferred embodiment of the electronic circuitry 24. However, it is understood that other suitable electronic circuitry may be used. For example, electronic circuitry 24 may be comprised of an analog to digital converter which receives the input analog signal. The digital signal output of the analog to digital converter may be fed to a decode circuit which would select one of the light emitting diodes to be energized depending upon the amplitude and polarity of the input signal.

Figure 5:
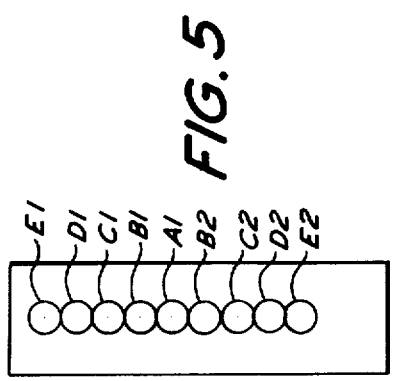
FIG. 5 is a drawing of the physical arrangement of the light emitting devices shown schematically in FIG. 4.

However, referring now to FIG. 4, there is shown an embodiment of electronic circuitry for energizing nine light emitting diodes as shown in FIG. 5. The light emitting diodes of FIG. 5 may be mounted in a row along the free end of cantilever 12 or in a row along reed 28. The light emitting diodes of FIG. 5 are labeled E1, D1, C1, B1, A1, B2, C2, D2 and E2 and correspond to the light emitting diodes, similarily labeled, in FIG. 4.

The input of the circuitry of FIG. 4 is applied across terminals 22. Terminals 22 have been given the same number as the input terminals to the electronic circuitry 24 of FIG. 1. The input appearing across terminals 22 is applied across a full wave bridge rectifier 34. Full wave bridge rectifiers are well known in the art and need not be described here in detail. The input appearing across input terminals 22 is also applied to polarity sensing circuit 36. Polarity sensing circuit 36 is provided with two outputs labeled X and Y. The output terminal X is provided with a high signal in the absence of an input signal. The output Y is provided with a high output signal when the input signal across terminals 22 goes negative. Various types of polarity sensing circuits may be used to provide these conditions and such polarity circuits are well known in the art. Therefore, the polarity sensing circuit 36 will not be described here in detail.

The output of bridge rectifier 34 is applied across line 38 and ground. This signal is applied to a plurality of voltage divider networks 40, 42, 44, 46 and 48. The voltage divider network 40 is comprised of resistors 50 and 52. Resistors 50 and 52 are chosen to cause inverter or threshold detector circuit 54 to be triggered when the voltage on line 38 reaches a first predetermined level. For purposes of illustration only, and not by way of limitation, the resistors of voltage divider network 40 may be selected to cause inverter or threshold detector circuit 54 to trigger when the voltage between line 38 and ground is one volt. Similarly, the resistors of voltage divider network 42 may be chosen to cause threshold detector 56 to trigger when the voltage between line 38 and ground is two volts. Similarly, the triggering point of inverter 58 may be set by voltage divider network 44 to be three volts across line 38 and ground. Similarly, voltage divider network 46 may cause a four volt level to trigger inverter 60 and voltage divider network 48 may cause a 5 volt level to trigger inverter 62, it being understood that the voltage level referred to is the voltage between line 38 and ground.

The X & Y outputs of polarity sensing circuit 36 are applied to the terminals of light emitting diodes as labeled in FIG. 4. In other words, terminal X is connected to one terminal of light emitting diodes labeled A1, B1, C1, D1, and E1. Terminal Y of polarity sensing circuit 36 is connected to one terminal of light emitting diodes B2, C2, D2 and E2.

In the absence of any input signal, the output of inverter circuit 54 is high and the output of inverter circuit 64 is low. This causes light emitting diode A1 to be energized due to the fact that the X output of the polarity sensing circuit is connected to a positive potential or high when there is no signal present on input terminals 22.

Using the threshold potentials of 1 volt, 2 volts, 3 volts, 4 volts and 5 volts for illustrative purposes as indicated above, when the voltage across line 38 and ground reaches a potential of 1 volt or more but less than 2 volts, threshold detector 54 is energized causing its output to go low. This causes the output of inverter circuit 64 to go high thereby causing light emitting diode A1 to be extinguished. Light emitting diode A1 corresponds to the center line of an oscilloscope and is present in the absence of any input signal. With the input signal across across line 38 and ground exceeding 1 volt but being less than 2 volts, the input signal on line 66 of NAND gate 68 is high. The input 70 of NAND gate 68 is also high since threshold dedector 56 has not been triggered. The output of NAND gate 68 is therefore low, since both inputs are high, thereby energizing light emitting diode B1 or B2 depending upon whether the X or Y output of polarity sensing circuit 36 is high. Assuming that the input signal on terminals 22 is positive, the X output of polarity sensing circuit 36 would be high thereby energizing light emitting diode B1.

Assuming that the input voltage on input terminals 22 continues to increase and the voltage across line 38 and ground exceeds 2 volts but remains less than 3 volts, threshold detector 56 would be energized causing its output to go low. This causes the output of NAND gate 68 to go high de-energizing light emitting diode B1. The output of threshold detector 56 going low causes the output of inverter 72 to go high causing the input 74 of NAND gate 76 to go high. Input 78 of NAND gate 76 is also high since the voltage across line 38 and ground is less than 3 volts. Since the signals on inputs 74 and 78 of NAND gate 76 are both high, the output of NAND gate 76 will be low causing light emitting diode C1 to be energized.

Inverter 80 and NAND gate 82 provide similar functions for light emitting diodes D1 and D2. Inverter 84 and NAND gate 86 provide similar functions for diodes E1 and E2.

In the embodiment being illustrated, a voltage in excess of 5 volts would cause none of the light emitting diodes to be lit. This is accomplished by turning on threshold detector 62 which causes a low signal on input 88 of NAND gate 86. This corresponds to the analogous situation of the beam of a cathode-ray tube being deflected off of the face of the cathode-ray tube.

The circuit operates in a similar manner for a negative signal on input terminals 22. In the case of a negative input signal on terminals 22, output terminal Y of polarity sensing circuit 36 would be high causing one of the light emitting diodes B2, C2, D2, or E2 to be energized depending upon the magnitude of the input signal. Of course, the use of nine light emitting diodes and associated circuitry has been chosen to illustrate a concrete embodiment of the invention, however more or less light emitting diodes and corresponding circuitry may be used.

Figure 6:
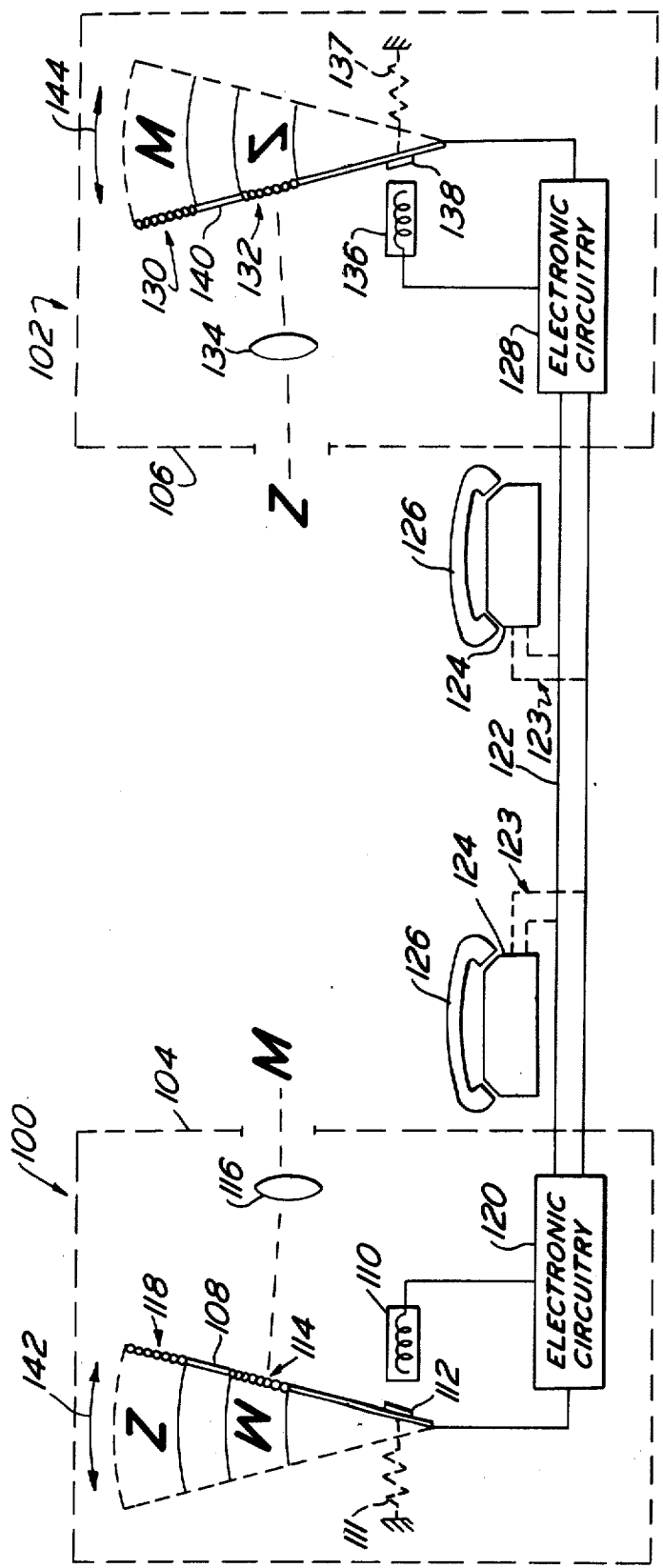
FIG. 6 is a diagram of a camera-display embodiment of the present invention.
Figure 7:
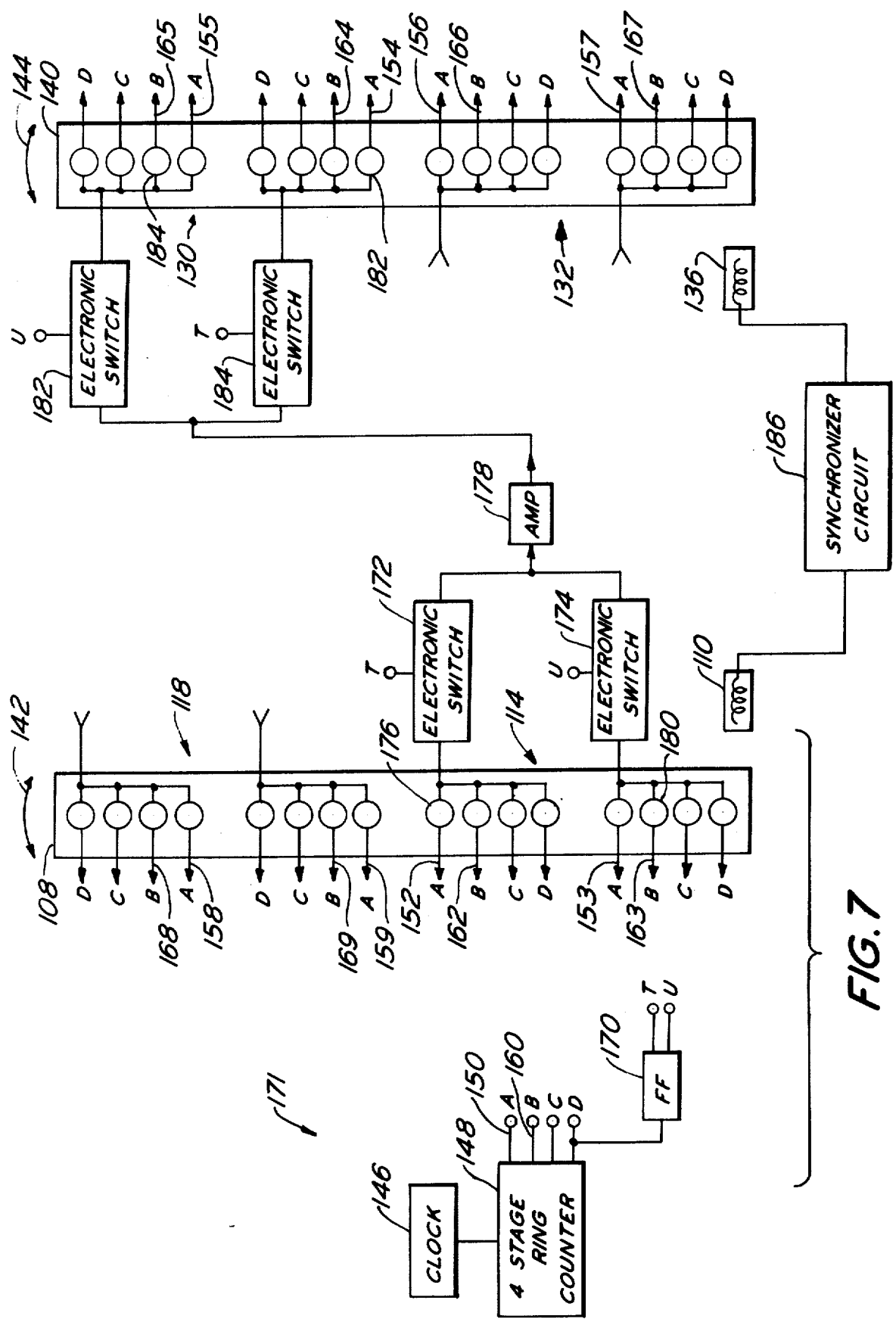
FIG. 7 is a schematic diagram, partially in block diagram form, of the circuitry of the embodiment of FIG. 6.

Referring now to FIG. 6, there is shown a camera-display embodiment of the present invention. A schematic diagram, partially in block diagram form, of the circuitry of the camera-display unit is shown in FIG. 7. Like elements in FIGS. 6 and 7 are given like numerals and letters.

The camera-display unit 100 and the camera-display unit 102 are similarly constructed. The camera-display units 100 and 102 are provided with housings 104 and 106, respectively. The camera-display unit 100 is provided with a vibrating reed member 108. The reed 108 is caused to vibrate by means of an electromagnetic coil 110 which operates a magnetizable material 112 mounted on the reed 108. The reed 108 may comprise a resilient material or a spring 111 (shown in dotted lines) may be provided to bias the reed 108 away from the electromagnetic coil 110. Preferably, the resilient forces are provided by the material of the reeds 108 and 140 and the springs 111 and 137 are not used since they insert an added mass into the system. The system is preferably operated at the mechanical resonant frequency of the reed system.

A plurality of radiant energy sensitive devices 114 are mounted on a portion of reed 108. The radiant energy sensitive devices may preferably be photo cells in the embodiment being described. However, many uses of the present invention reside in the field of providing a means of monitoring radiant energy by viewing it at a remote location. For example, the present invention may be used to monitor X-rays at a remote location. Also, in various uses of the present invention, it may be desirable to view infrared and ultraviolet radiation by means of the present invention where the radiant energy sensitive devices are sensitive to the particular type of radiation, infrared or ultraviolet. The use of the term photocells herein is not intended to limit the scope of the present invention.

The radiant energy sensor devices 114, in conjunction with the electronic circuitry and other components, form the camera portion of the camera-display unit. A lense 116 is provided to focus the image on the radiant energy sensitive devices, especially where the radiant energy received by the radiant energy sensitive devices 114 is in the visible wave length range. The lense 116, although shown to the side of the reed 114, would be directly in front of the radiant energy sensitive devices 114 in order to focus the image on the radiant energy sensitive devices 114 as they are caused to scan by means of the vibration or movement of reed 108.

Light emitting devices or light emitting diodes 118 are mounted on a second portion of reed 108. Preferably, the light emitting devices 118 are light emitting diodes and will be referred to hereinafter as such. The light emitting diodes 118 form the display portion of the camera-display unit 100.

The signals generated by radiant energy sensitive devices or photo cells 114 are fed to electronic circuitry 120. The signals applied to light emitting diodes 118 are received from electronic circuitry 120. Of course, the output signals of radiant energy sensitive devices 114 could be processed by electronic circuitry 120 and applied to light emitting diodes 118 to generate the image which is impingent upon radiant energy sensitive devices or photo cells 114. However, it is usually more useful to be able to display the image at a remote location. Therefore, the output signals of the radiant energy sensitive devices or photo cells 114 are preferably processed by electronic circuitry 120 and transmitted to a second unit, such as camera-display unit 102. This transmission may be by means of a direct line such as shown by lines 122 or by means of telephone adapters 124, shown connected by dotted lines 123, and conventional telephone systems which are illustrated by showing telephone handsets 126 of such a telephone system since such telephone systems are conventional and well known in the art.

The signals received from electronic circuitry 120 are processed by electronic circuitry 128 and applied to light emitting diodes 130. Light emitting diodes 130 form the display portion of camera-display unit 102. Radiant energy sensitive devices or photocells 132 form the camera portion of camera-display unit 102. The radiant energy sensitive devices will be referred to hereinafter as photocells for convenience and simplification of terms without in any way limiting the types of device that may be used as radiant energy sensitive devices. Camera-display unit 102 is also provided with a lens 134 for focusing the image on photocells 132. An electromagnetic coil 136 and associated magnetic material 138 function to cause reed 140 to vibrate or move back and forth enabling the photocells to scan a raster or area on which the image is projected by the lens and enabling the light emitting devices to scan the display area. Coils 110 and 136 may operate against the resilient forces of springs 111 and 137, respectively, or against the resilient forces of reeds 108 and 140. Reed 108 vibrates or moves in the direction of double headed arrow 142, and reed 140 vibrates or moves in the direction of double headed arrow 144. It may be noted that the reeds are caused to vibrate 180 degrees out of phase in order to properly reproduce the image by compensating for the image inversion on photocells 114 as shown in FIG. 6. This may readily be accomplished by various means such as modifying the electrical signal or, as illustrated, by positioning of the electromagnetic coils 110 and 136. That is, when similar signals are simultaneously applied to coils 110 and 136, the reeds are drawn to relative opposite extremes. For example, as shown in FIG. 6, with coils 110 and 136 energized, reed 108 would be at its extreme right position and reed 140 would be at its extreme left position.

Although a camera and display light emitting diodes are shown mounted on each reed, it is clear that each reed may contain only camera photocells or display light emitting diodes. This would provide a more economical structure where only one way transmission of an image is desired.

Referring now to FIG. 7, in conjunction with FIG. 6, there is shown a timing circuit 171 including a clock circuit 146. Clock circuit 146 provides a clock signal to a four stage ring counter 148. Ring counter 148 has four outputs labeled A, B, C, and D. As is conventional and well known in the art, a ring counter provides a high signal on each output in sequence, with only one output being high at any one time. The output labeled A is tied to each point in FIG. 7 which is also labeled with an A. For example, point 150 would be tied to points 152 through 159. Point 160, which is output terminal B of ring counter 148, would be tied to points 162 through 169.

The D output of ring counter 148 is applied to flip flop 170 which produces the T and U outputs as labeled. The T and U outputs reverse their signal state conditions each time the ring counter 148 counts through a ring or in other words each time the D output goes high. The T and U outputs are similarly connected to all other points in FIG. 7 labeled T and U, respectively, including the inputs to electronic switches 172, 174, 182 and 184.

Referring to FIG. 7, the circuitry for operation of photocells 114 and light emitting diodes 130 is shown in detail in block diagram form. The circuitry for photocells 132 and light emitting diodes 118 is identical to that of the circuitry for photocells 114 and light emitting diodes 130, respectively, and is not shown in order to simplify the drawings.

As described with respect to FIG. 6, the reeds or members 108 and 140 are vibrated or moved in the directions of double headed arrows 142 and 144, respectively, by means of electromagnetic coils 110 and 136, respectively. The timing circuit 171 outputs A, B, C, D, T and U are applied as indicated above to each of the similarly labeled terminals or points. As photocells 114 scan an image, the electrical outputs or electrical characteristics of the individual photocells vary depending upon the amount of radiation instantaneously inpinging upon each photocell or other radiant energy sensitive device. These outputs are enabled by the A, B, C or D outputs of ring counter 148. Additionally one of the electronic switches 172 or 174 is energized by means of the outputs of flip-flop 170 depending upon whether the T or U output is high. For example, assuming that the T and A outputs of timing circuit 171 are high, electronic switch 172 would be enabled and the output of photocell 176 would be fed to amplifier 178. As a second example, assuming that the B and U outputs of timing circuit 170 were high, the output of photocell 180 would be fed to amplifier 178 via electronic switch 174.

The output of amplifier 178 is fed to electronic switches 182 and 184 by means of a direct line, a telephone system or other suitable communications network as described with respect to FIG. 6. Either electronic switch 182 or electronic switch 184 is energized depending upon which one of the T and U outputs of flip-flop 170 is high.

Assuming the example given above, of both the T & A outputs of timing circuit 170 being high, light emitting diode 182 would be energized in accordance with the output of photocell 176. With respect to the second example above, if the U & B outputs of the timing circuit 171 were high, light emitting diode 184 would be energized in accordance with the output signal of photocell 180. Similarly, the other photocells and light emitting diodes would be enabled in the sequence of the following outputs of timing circuit 171 going high; T and A, T and B, T and C, T and D, U and A U and B, U and C, U and D, T and A, etcetra.

The position of corresponding photocells in the camera and light emitting diodes in the display portion are inverted to make the display come out properly due to the inversion of the image on the photocells as shown in FIG. 6.

The synchronizer circuit 186 provides suitable signals to electromagnetic coils 110 and 136 providing proper movement of reed members 108 and 140. As shown in FIG. 7, a single synchronizer circuit is used which is coupled to both electromagnetic coils 110 and 136 by direct lines. However, in the case of camera-display units coupled together by means of a telephone or radio communications system, a driving circuit for the electromagnetic coil in each camera-display unit may be provided. These driving circuits would be synchronized to drive the electromagnetic coils by means of a synchronizing pluse transmitted over the telephone or radio communications system.

Although the electromagnets or coils in the various embodiments of the invention may be used to drive the cantilevers or reeds at various frequencies, it is preferred that the resonant frequency of the mechanical structure be chosen so that the electromagnet or coil would drive the physical structure at its resonant frequency. This provides an advantage of reducing the amount of energy which is required to drive or vibrate the mechanical structure.

It is also apparent throughout that the effect of a lissajou pattern or other display is created, even though only one light emitting diode may be energized at any instant, due to the inability of the human eye to perceive rapidly changing instantaneous displays. In other words, the present invention utilizes the same characteristics of the human eye which enable a person to effectively perceive a picture on a television tube or enjoy a motion picture.

It will be apparent to those skilled in the art that various changes and modifications may be made to the structure disclosed herein within the teachings and spirit of the present invention. For example, various types of structural changes may be made in the reed or cantilever mounting and means for driving it. Mechanical switches may be used in place of the electronic switches. Various means of synchronizing the electromagnetic coils and various other means for driving the reeds or cantilevered elements may be used. The reeds, especially in the oscilloscope type embodiments, may also be set into resonant vibration by manually deflecting the cantilever or reed member, and for this purpose the unit is constructed so that such manual force may be applied either directly or indirectly to the cantilever or reed members. As indicated above, the term photocell includes, within the meaning of this invention, all types of radiant energy sensitive devices and includes photo transistors, photo diodes, vacuum tube photo electric cells and various other types of devices which change their electrical characteristics or outputs in response to radiant energy.

In view of the above, the present invention may be embodied in other specific forms without departing from the spirit or essential attributes thereof and, accordingly, reference would be made to the appended claims, rather than to the foregoing specification as indicating the scope of the invention.

I claim:

1. Apparatus for sensing and displaying an image, comprising:

a row of a plurality of radiant energy sensitive devices;

a row of a plurality of energizable light emitting devices;

means for synchronously moving said row of radiant energy sensitive devices to scan the image and means to move said row of light emitting devices in synchronism with said row of radiant energy sensitive devices;

means for enabling each one of said plurality of radiant energy sensitive devices and a corresponding one of said plurality of light emitting devices in a predetermined sequence; and means for applying the output of the enabled radiant energy sensitive device to the enabled light emitting device.

2. Apparatus in accordance with claim 1 wherein said radiant energy sensitive devices are mounted in a row along a reed mounted to vibrate.

3. Apparatus in accordance with claim 1 wherein said radiant energy sensitive devices are mounted in a row along a free end of a cantilever.

4. Apparatus in accordance with claim 1 wherein said light emitting devices are mounted in a row along a reed mounted to vibrate.

5. Apparatus in accordance with claim 1 wherein said light emitting devices are mounted in a row along a free end of a cantilever.

6. Apparatus in accordance with claim 1 wherein said light emitting devices are light emitting diodes.

7. Apparatus in accordance with claim 1 wherein said means for synchronously moving said row of radiant energy sensitive devices to scan the image and said means to move said row of light emitting devices each comprise electromagnetic means for moving said radiant energy sensitive devices and said light emitting devices, said electromagnetic means being driven in synchronism by electrical circuit means.

8. Apparatus in accordance with claim 1 wherein said radiant-energy sensitive devices and said light emitting devices are mounted on a single vibrating member.

9. Apparatus in accordance with claim 1 wherein said radiant-energy sensitive devices are mounted on a first vibrating member and said light emitting devices are mounted on a second vibrating member synchronized with the vibrations of said first member.

10. Apparatus in accordance with claim 1 wherein said means for applying the output of the enabled radiant energy sensitive device to the enabled light emitting device includes amplifier means.

11. Apparatus in accordance with claim 10 wherein said means for applying the output of the enabled radiant energy sensitive device to the enabled light emitting device further includes a telephone system.

12. Apparatus for displaying an input signal, comprising:

a member having a plurality of light emitting devices arranged in a row;

means for moving said member at a predetermined rate; and electronic circuit means for applying energization signals to selected ones of said plurality of light emitting devices in response to said input signal, said electronic circuit means including circuit means for selectively providing an energization signal to a predetermined light emitting device in response to said input signal being between predetermined voltage levels for a particular light emitting device.

13. Apparatus in accordance with claim 12 wherein said member is in the form of a reed and said light emitting devices are arranged in a row along a portion of the length of the reed.

14. Apparatus in accordance with claim 12 wherein said member is a vibratable cantilever mounted at one end and said light emitting devices are arranged in a row along the opposite end of the member which is free to vibrate.

15. Apparatus in accordance with claim 12 wherein said light emitting devices are light emitting diodes.

16. Apparatus in accordance with claim 12 wherein said means for moving said member includes a vibrating means comprising an electromagnet which is selectively operable on a magentizable portion of said member.

17. Apparatus in accordance with claim 1 wherein said row of radiant energy sensitive devices are mounted on vibrating members, said vibrating members being vibrated at the resonant frequency of the mechanical structure of the member.

18. Apparatus in accordance with claim 12 wherein said member is vibrated at the resonant frequency of the mechanical structure of the member.

19. A display apparatus, comprising:

a plurality of light emitting devices arranged in a row;

means for moving said light-emitting devices in a periodic manner;

an electronic circuit means for energizing only a predetermined one of said plurality of light emitting devices in response to an input signal voltage being between a first and a second predetermined voltage level for said predetermined light emitting device.

20. A display apparatus in accordance with claim 19 wherein said electronic circuit means includes:

an input for receiving the input signal voltage;

a full wave rectifier for rectifying the input signal voltage appearing at said input;

a plurality of resistor networks, each resistor network being associated with a corresponding light emitting device and receiving the rectified output of said full wave rectifier, each of said resistor networks providing a minimum predetermined tripping output level in response to one of a plurality of predetermined minimum output voltages of said full wave rectifier;

a plurality of threshold detector circuit means, each of said threshold detector circuit means receiving the output of a corresponding resistor network and causing energization of a corresponding light emitting device.

21. A display apparatus in accordance with claim 19 wherein said light emitting devices are light emitting diodes.

22. A display apparatus in accordance with claim 20 including gating circuit means connected between the outputs of threshold detector circuit means and the light emitting devices corresponding to voltage levels lower than the voltage level of the input signal.

23. A display apparatus in accordance with claim 20 wherein said plurality of light emitting devices are divided into a first group corresponding to a positive polarity input signal voltage and a second group corresponding to a negative polarity input signal voltage, and including a polarity sensing circuit for sensing the polarity of the input signal voltage appearing at said input and enabling said first group of light emitting devices if said input signal voltage is positive and enabling said second group of light emitting devices if said input signal voltage is negative.

24. Apparatus for sensing and displaying an image, comprising:
- a row of a plurality of radiant energy sensitive devices, said row being comprised of a first predetermined number of groups of a second predetermined number of radiant energy sensitive devices;
- a row of a plurality of energizable light emitting devices; said row being comprised of said first predetermined number of groups of said second predetermined number of light emitting devices;
- means for synchronously moving said row of radiant energy sensitive devices to scan the image and said row of light emitting devices;
- electronic circuit means for enabling each one of said plurality of radiant energy sensitive devices and a corresponding one of said plurality of light emitting devices in a predetermined sequence, said electronic circuit means including electronic switch means for closing circuitry connected to a group of radiant energy sensitive devices and a corresponding group of energizable light emitting devices, and counting circuit means for sequentially enabling corresponding radiant energy sensitive devices and light emitting devices in the corresponding groups;
- means for applying the output of the enabled radiant energy sensitive device to the enabled light emitting device.

25. Apparatus in accordance with claim 24 wherein said counting circuit means comprises a ring counter.

26. Apparatus in accordance with claim 25 wherein said first predetermined number is 2 and said electronic switch means are operated in response to the output of a flip flop circuit driven by one of the outputs of said ring counter.

27. Apparatus in accordance with claim 24 wherein said means for applying the output of the enabled radiant energy sensitive device to the enabled light emitting device includes amplifier means.

28. Apparatus in accordance with claim 24 wherein said electronic circuit means includes a telephone link for applying the output of the enabled radiant energy sensitive device to the enabled light emitting device.

* * * * *